(12) United States Patent
Luo et al.

(10) Patent No.: US 12,089,393 B2
(45) Date of Patent: Sep. 10, 2024

(54) MEMORY AND METHOD FOR FORMING SAME

(71) Applicant: CHANGXIN MEMORY TECHNOLOGIES, INC., Hefei (CN)

(72) Inventors: Qu Luo, Hefei (CN); WenHao Hsieh, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 467 days.

(21) Appl. No.: 17/385,043

(22) Filed: Jul. 26, 2021

(65) Prior Publication Data

US 2021/0351189 A1  Nov. 11, 2021

Related U.S. Application Data

(63) Continuation of application No. PCT/CN2021/080783, filed on Mar. 15, 2021.

(30) Foreign Application Priority Data

Mar. 31, 2020 (CN) .......................... 202010242398.5

(51) Int. Cl.
*H01L 27/108* (2006.01)
*H01L 21/8234* (2006.01)
(Continued)

(52) U.S. Cl.
CPC ... *H10B 12/053* (2023.02); *H01L 21/823437* (2013.01); *H01L 29/66734* (2013.01); *H01L 29/7813* (2013.01); *H10B 12/34* (2023.02)

(58) Field of Classification Search
CPC ....... H01L 21/823437; H01L 29/66734; H01L 29/7813; H01L 29/4236; H01L 29/66621; H10B 12/053; H10B 12/488
See application file for complete search history.

(56) References Cited

U.S. PATENT DOCUMENTS

2001/0025973 A1  10/2001  Yamada
2008/0146002 A1   6/2008  Kang
(Continued)

FOREIGN PATENT DOCUMENTS

CN  100595924 C  3/2010
CN  108172579 A  6/2018
(Continued)

OTHER PUBLICATIONS

First Office Action of the European application No. 21762995.5, issued on Feb. 17, 2023, 6 pages.
(Continued)

*Primary Examiner* — Victor A Mandala
*Assistant Examiner* — Lawrence C Tynes, Jr.
(74) *Attorney, Agent, or Firm* — Syncoda LLC; Feng Ma

(57) ABSTRACT

A memory and a method for forming the same are provided. In the method, a word line trench is formed in active regions and an isolation layer. The formed word line trench includes a first partial word line trench located in the active regions and a second partial word line trench located in the isolation layer. The width and depth of the second partial word line trench are greater than the width and depth of the first partial word line trench respectively. Therefore, when a word line structure is formed in the word line trench, the formed word line structure also includes a first partial word line structure located in the first partial word line trench and a second partial word line structure located in the second partial word line trench.

18 Claims, 12 Drawing Sheets

(51) Int. Cl.
    *H01L 29/66*     (2006.01)
    *H01L 29/78*     (2006.01)
    *H10B 12/00*     (2023.01)

(56) References Cited

U.S. PATENT DOCUMENTS

| | | | |
|---|---|---|---|
| 2010/0193901 A1 | 8/2010 | Jang | |
| 2014/0256125 A1 | 9/2014 | Jang et al. | |
| 2015/0371895 A1 | 12/2015 | Yokomichi | |
| 2018/0175040 A1* | 6/2018 | Kim | H10B 12/0335 |
| 2018/0342613 A1* | 11/2018 | Chang | H01L 21/47573 |
| 2019/0326297 A1* | 10/2019 | Ujihara | H01L 29/6656 |
| 2019/0341487 A1 | 11/2019 | Chang et al. | |
| 2021/0035983 A1* | 2/2021 | Song | H10B 12/053 |
| 2021/0126090 A1* | 4/2021 | Kim | H01L 29/4238 |

FOREIGN PATENT DOCUMENTS

| | | |
|---|---|---|
| CN | 209087842 U | 7/2019 |
| CN | 111640745 A | 9/2020 |

OTHER PUBLICATIONS

First Office Action of the Chinese application No. 202010242398.5, issued on Apr. 13, 2023, 9 pages.
Written Opinion cited in PCT/CN2021/080783, mailed on Jun. 16, 2021, 8 pages.
Supplementary European Search Report in the European application No. 21762995.5, mailed on May 13, 2022, 8 pgs.
International Search Report in the international application No. PCT/CN2021/080783, mailed on Jun. 16, 2021, 2 pgs.

\* cited by examiner

MEMORY AND METHOD FOR FORMING SAME

CROSS-REFERENCE TO RELATED APPLICATIONS

The present application is a U.S. continuation application of International Application No. PCT/CN2021/080783, filed on Mar. 15, 2021, which claims priority to Chinese Patent Application No. 202010242398.5, filed on Mar. 31, 2020. International Application No. PCT/CN2021/080783 and Chinese Patent Application No. 202010242398.5 are incorporated herein by reference in their entireties.

TECHNICAL FIELD

The disclosure relates to the field of memories, and in particular to a memory and a method for forming the same.

BACKGROUND

A Dynamic Random Access Memory (DRAM) is a semiconductor memory device commonly used in computers, which is composed of a plurality of repeated memory units. Each of the memory units usually includes a capacitor and a transistor. A gate of the transistor is connected with a word line, a drain of the transistor is connected with a bit line, and a source of the transistor is connected with the capacitor. Voltage signals on the word line may control turn-on or turn-off of the transistor, so that data information stored in the capacitor may be read through the bit line, or data information may be written into the capacitor through the bit line for storage.

In order to improve the integration level of a memory structure, the transistor in the DRAM usually uses a trench transistor structure. A specific structure of the trench transistor structure includes a semiconductor substrate, a trench located in the semiconductor substrate, a gate (or a word line structure) located in the trench, and a source region and a drain region located at two sides of the trench in the semiconductor substrate. The gate of the trench transistor is connected with the word line, the drain region is connected with the bit line, and the source region is connected with the capacitor.

The trench transistor of the conventional DRAM still has the problems of high threshold voltage, low switching speed, and low working current.

SUMMARY

To this end, an embodiment of the disclosure provides a method for forming a memory, which may include:
providing a semiconductor substrate, where a plurality of separate active regions may be formed on the semiconductor substrate and isolated through an isolation layer;
forming a word line trench both in the active regions and the isolation layer by etching, where the word line trench may include a first partial word line trench located in the active regions and a second partial word line trench located in the isolation layer, the first partial word line trench may be interconnected with the second partial word line trench, and a width and a depth of the second partial word line trench may be greater than a width and a depth of the first partial word line trench respectively; and
forming a word line structure in the word line trench, where the word line structure may include a first partial word line structure located in the first partial word line trench and a second partial word line structure located in the second partial word line trench, the first partial word line structure may be interconnected with the second partial word line structure, and a width and a depth of the second partial word line structure may be greater than a width and a depth of the first partial word line structure respectively.

An embodiment of the disclosure also provides a memory, which may include:
a semiconductor substrate, where the semiconductor substrate may have a plurality of separate active regions, which may be isolated through an isolation layer;
a word line trench located in the active regions and the isolation layer, where the word line trench may include a first partial word line trench located in the active regions and a second partial word line trench located in the isolation layer, the first partial word line trench may be interconnected with the second partial word line trench, and a width and a depth of the second partial word line trench may be greater than a width and a depth of the first partial word line trench respectively; and
a word line structure located in the word line trench, where the word line structure may include a first partial word line structure located in the first partial word line trench and a second partial word line structure located in the second partial word line trench, the first partial word line structure may be interconnected with the second partial word line structure, and a width and a depth of the second partial word line structure may be greater than a width and a depth of the first partial word line structure respectively.

DETAILED DESCRIPTION

Figure 1:
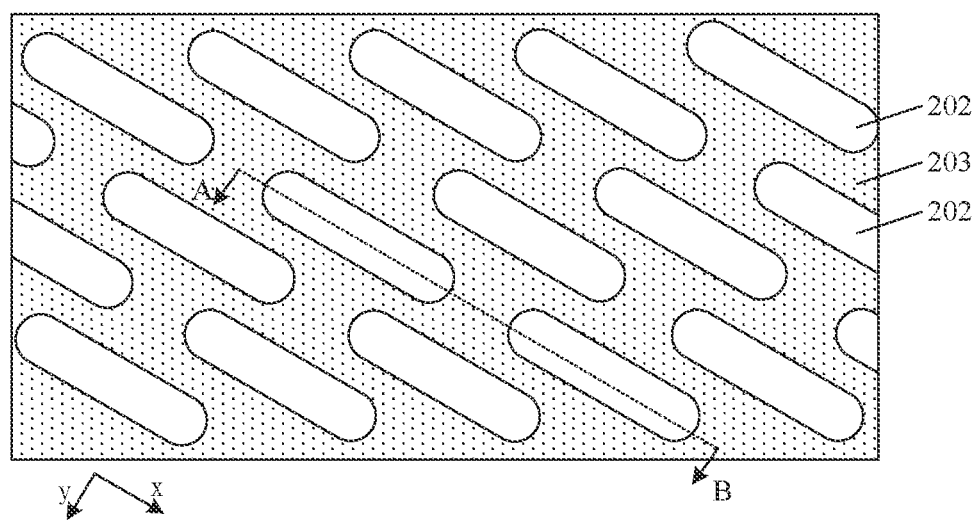
FIG. 1-FIG. 12 are schematic structure diagrams of a memory forming process according to embodiments of the disclosure.

As described in BACKGROUND, a trench transistor of a memory (DRAM) still has the problems of high threshold voltage, low switching speed, and low working current.

It has been found that the threshold voltage, switching speed, and working current of the trench transistor of the memory (DRAM) are limited by the control capability of a word line and the width of a channel. In a conventional memory (DRAM), the control capability of a word line is limited and the width of a channel is limited.

To this end, the disclosure provides a memory and a method for forming the memory. According to the method, a word line trench is formed in active regions and an isolation layer. The formed word line trench includes a first partial word line trench located in the active regions and a second partial word line trench located in the isolation layer. The first partial word line trench is interconnected with the second partial word line trench. A width and a depth of the second partial word line trench are greater than a width and a depth of the first partial word line trench respectively. Therefore, when a word line structure is formed in the word line trench, the formed word line structure accordingly includes a first partial word line structure located in the first partial word line trench and a second partial word line structure located in the second partial word line trench. The first partial word line structure is interconnected with the second partial word line structure. A width and a depth of the second partial word line structure are both greater than a width and a depth of the first partial word line structure. Indeed, such a "fin-type" word line structure across the active regions increases the contact area between the word line structure and the active regions, so that the control capability of the word line structure on a channel is improved, and the working frequency of a trench transistor is improved. Therefore, the working frequency of a memory (DRAM) is improved. Furthermore, by means of such a structure, the width of the channel of the trench transistor is increased, the working current of the trench transistor is increased, the threshold voltage of the trench transistor is reduced, and the performance of the memory (DRAM) is improved.

In order that the above objects, features, and advantages of the disclosure can be more readily understood, specific implementations of the disclosure will now be described in detail with reference to the accompanying drawings. In the detailed description of the embodiments of the disclosure, for convenience of description, the schematic diagram will be partially enlarged but not to scale, and the schematic diagram is only illustrative, which should not be construed as limitations to the protection scope of the disclosure. In addition, three-dimensional space dimensions of length, width, and depth should be included in actual production.

FIG. 1-FIG. 12 are schematic structure diagrams of a memory forming process according to embodiments of the disclosure.

Figure 2:
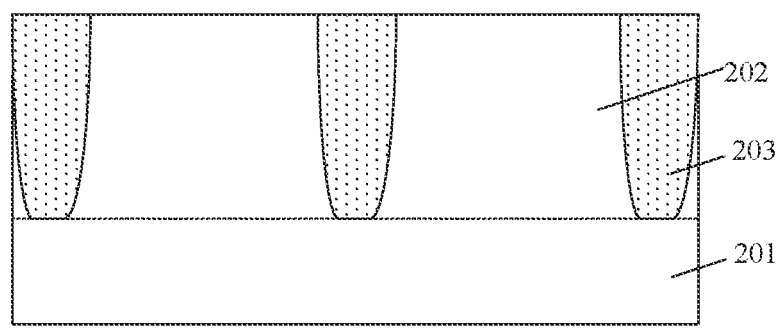

Referring to FIG. 1-FIG. 2, FIG. 2 is a schematic diagram showing a cross-sectional structure of FIG. 1 in a direction of a cutting line AB. A semiconductor substrate 201 is provided. A plurality of separate active regions 202 are formed on the semiconductor substrate 201. The plurality of active regions 202 are isolated through an isolation layer 203.

The semiconductor substrate 201 may be made of silicon (Si), germanium (Ge), silicon germanium (GeSi), silicon carbide (SiC), silicon-on-insulator (SOI), germanium-on-insulator (GOI), or other materials, e.g. III-V group compounds such as gallium arsenide. The semiconductor substrate 201 is made of silicon in the present embodiment. Certain impurity ions are doped in the semiconductor substrate as required. The impurity ions may be N-type impurity ions or P-type impurity ions. In one embodiment, the doping includes well region doping and source/drain region doping.

A forming process of the active regions 202 and the isolation layer 203 is as follows. A first mask layer (not shown in the figure) is formed on the semiconductor substrate 201, where a plurality of first mask openings are arranged in parallel in the first mask layer. The semiconductor substrate 201 is etched along the first mask openings by taking the first mask layer as a mask, to form a plurality of separate strip-shaped active regions in the semiconductor substrate 201. A first trench is provided between every two adjacent strip-shaped active regions. The strip-shaped active regions are etched to form a plurality of second trenches in the strip-shaped active regions. Each of the strip-shaped active regions is divided into a plurality of active regions 202 by the second trenches. An isolation material is filled in the first trench and the second trench to form an isolation layer 203. The isolation layer 203 may be made of silicon oxide or other suitable isolation materials. (In other embodiments, the first trench may be filled with an isolation material to form a first isolation layer, the strip-shaped active regions are etched after the first isolation layer is formed, a plurality of second trenches are formed in the strip-shaped active regions, and then the second trench is filled with an isolation material to form a second isolation layer, where the first isolation layer and the second isolation layer form an isolation layer). It is to be noted that the active regions 202 and the semiconductor substrate 201 are separated by a dashed line in order to conveniently identify the active regions 202 and the semiconductor substrate 201.

In other embodiments, the active regions 202 may be formed by an epitaxial process.

In the present embodiment, an x-axis direction shown in FIG. 1 may be used as a row direction, a y-axis direction shown in FIG. 1 may be used as a column direction, and the positions of the active regions 202 in adjacent rows may have a certain misalignment.

Figure 3:
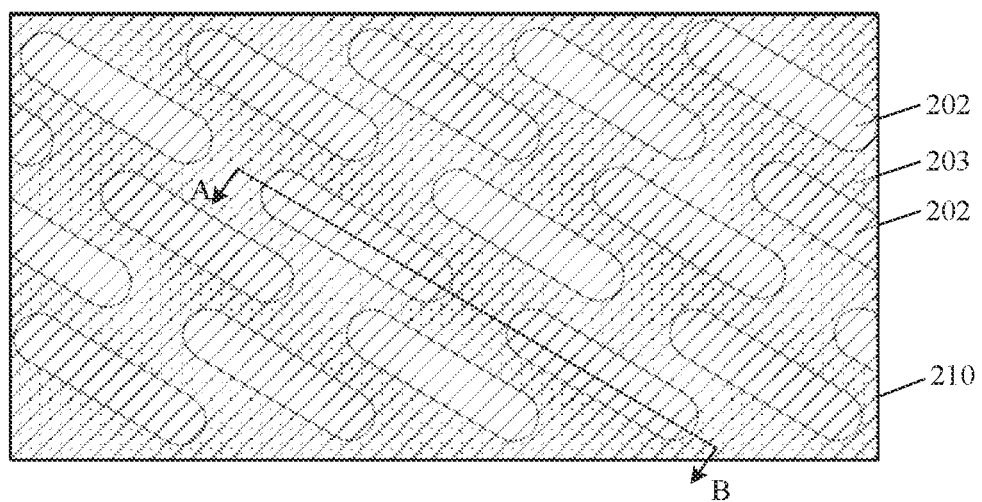
Figure 4:
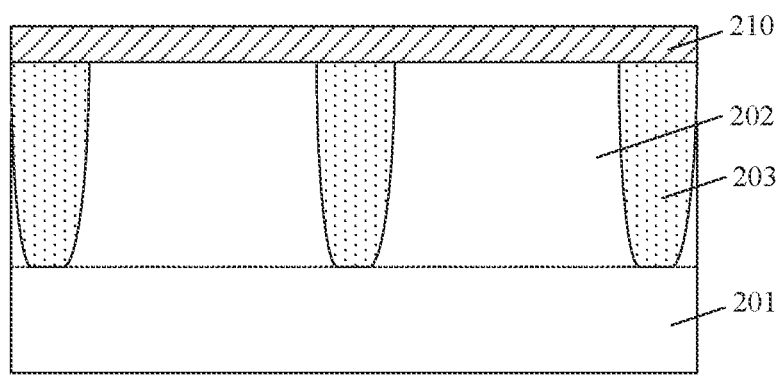

Referring to FIG. 3 and FIG. 4, FIG. 4 is a schematic diagram showing a cross-sectional structure of FIG. 3 in a direction of a cutting line AB. A mask layer 210 is formed on the active regions 202 and the isolation layer 203.

The mask layer 210 is a hard mask layer. The mask layer 210 may be made of one or more of silicon oxide, silicon nitride, and silicon oxynitride. The mask layer 210 may be of a single-layer or multi-layer stacked structure.

In the present embodiment, the mask layer 210 includes a silicon nitride layer, an amorphous carbon layer on the silicon nitride layer, an inorganic anti-reflective coating on the amorphous carbon layer, and a photoresist layer on the inorganic anti-reflective coating. The silicon nitride layer and the amorphous carbon layer are formed by a chemical vapor deposition process, and the inorganic anti-reflective coating and the photoresist layer are formed by a spin coating process.

Figure 5:
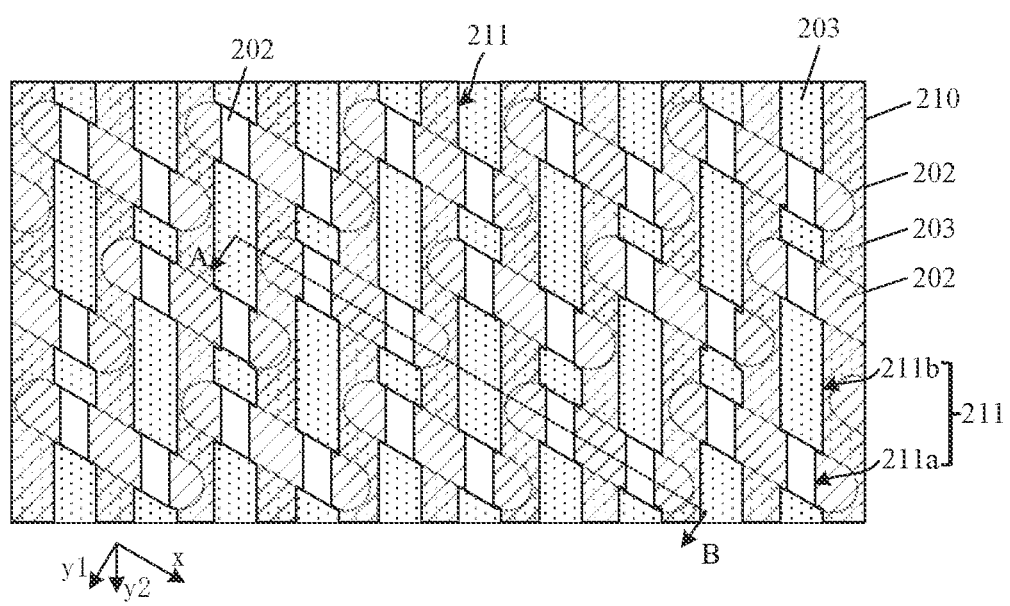
Figure 6:
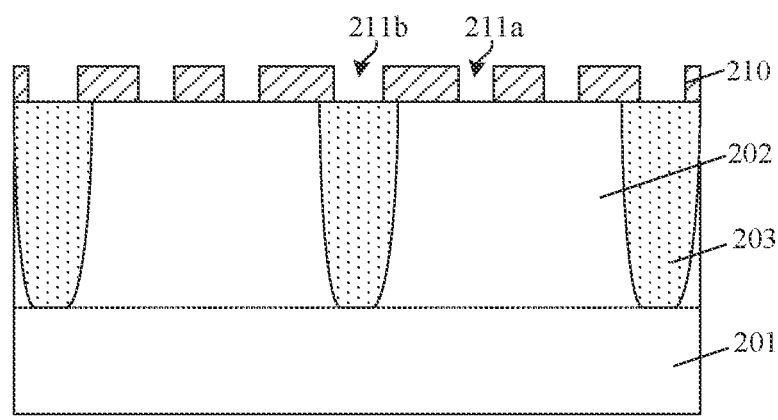

Referring to FIG. 5 and FIG. 6, FIG. 6 is a schematic diagram showing a cross-sectional structure of FIG. 5 in a direction of a cutting line AB. A plurality of parallel openings 211 are formed in the mask layer 210. An extending direction of the openings 211 and an extending direction of the active regions 202 form an angle. Each of the openings 211 includes a plurality of first openings 211a and a plurality of second openings 211b which are arranged alternately. The first opening 211a is interconnected with the second opening 211b. The width of each of the second openings 211b is greater than the width of each of the first openings 211a. A partial surface of the active regions 202 is exposed from the bottom of the first opening 211a. A partial surface of the isolation layer 203 between two adjacent ones of the active regions 202 is exposed from the second opening 211b.

The mask layer 210 is patterned to form the opening 211 in the mask layer 210. Specifically, the photoresist layer in the mask layer 210 is exposed and developed to pattern the photoresist. Then, the remaining mask layer 210 is etched by taking the patterned photoresist layer as a mask, to form the opening 211 in the mask layer 210.

In the present embodiment, the remaining mask layer 210 is etched by using an anisotropic dry plasma etching process. The anisotropic dry plasma etching process includes a first dry plasma etching step, a second dry plasma etching step, a third dry plasma etching step, and a fourth dry plasma etching step. Specifically, a photoresist base film is removed from the photoresist by using the first dry plasma etching step. A gas used in the first dry plasma etching step includes $O_2$ and $Cl_2$. A flow range of $O_2$ is 5-15 sccm. A flow range of $Cl_2$ is 5-15 sccm. An etching time is 3-8 s. The inorganic anti-reflective coating is etched by using the second dry plasma etching step. A gas used in the second dry plasma etching step includes HBr and $CF_4$. A flow range of HBr is 80-90 sccm. A flow range of $CF_4$ is 150-180 sccm. An etching time is 25-35 s. The amorphous carbon layer is etched by using the third dry plasma etching step. A gas used in the third dry plasma etching step includes $O_2$ and $SO_2$. A flow range of $O_2$ is 80-90 sccm. A flow range of $SO_2$ is 150-180 sccm. An etching time is 70-90 s. The silicon nitride layer is etched by using the fourth dry plasma etching step. A gas used in the fourth dry plasma etching step includes $CF_4$, $CH_2F_2$, and He. A flow range of $CF_4$ is 40-60 sccm. A flow range of $CH_2F_2$ is 15-25 sccm. A flow range of He is 90-110 sccm. An etching time is 25-35 s.

The mask layer 210 serves as a mask when the active regions 202 and the isolation layer 203 are subsequently etched to form the word line trench. In the present embodiment, the opening 211 formed in the mask layer 210 includes a plurality of first openings 211a and a plurality of second openings 211b which are arranged alternately. The first opening 211a is interconnected with the second opening 211b. The width of each of the second openings 211b is greater than the width of each of the first openings 211a. A partial surface of the active regions 202 is exposed from the bottom of the first opening 211a. A partial surface of the isolation layer 203 between two adjacent ones of the active regions 202 is exposed from the second opening 211b. Subsequently, the active regions 202 and the isolation layer 203 are etched along the first openings 211a and the second openings 211b by taking the mask layer 210 as a mask. When a word line trench is formed in the active regions 202 and the isolation layer 203, the corresponding word line trench includes a first partial word line trench located in the active regions (corresponding to the width and position of the first opening 211a) and a second partial word line trench located in the isolation layer (corresponding to the width and position of the second opening 211b). The first partial word line trench is interconnected with the second partial word line trench, and the width and depth of the second partial word line trench are greater than the corresponding width and depth of the first partial word line trench respectively. Therefore, according to the foregoing method, the foregoing word line trench with a specific shape may be formed simply and conveniently by only one patterning process of the mask layer and one etching process of the active regions 202 and the isolation layer 203. Moreover, the positional and dimensional accuracy of the first partial word line trench and the second partial word line trench in the formed word line trench is high, and the performance of the subsequently formed word line structure is improved.

Figure 7:
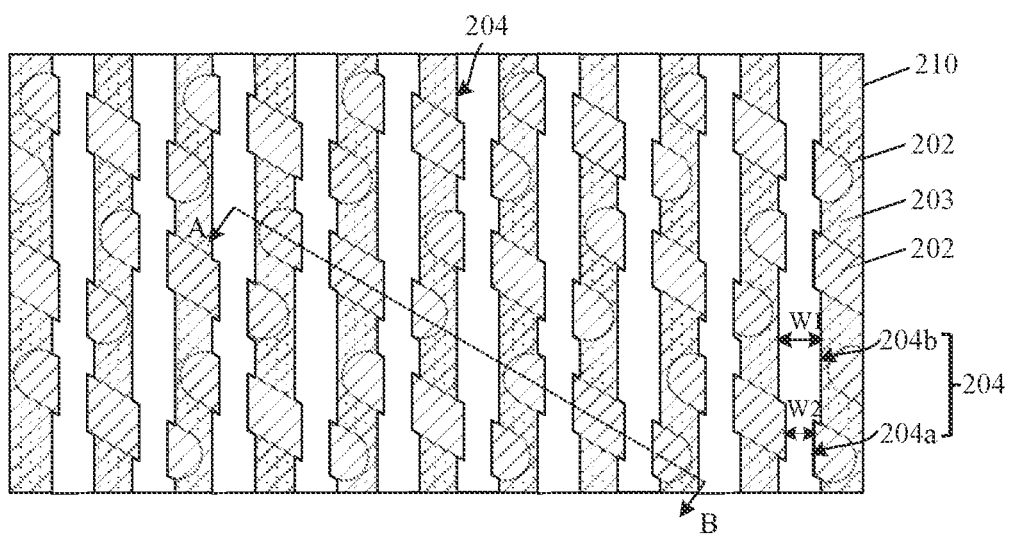
Figure 8:
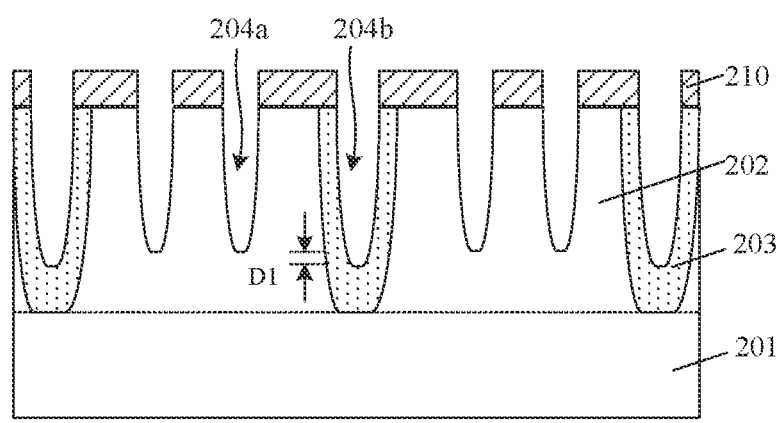

Referring to FIG. 7 and FIG. 8, FIG. 8 is a schematic diagram showing a cross-sectional structure of FIG. 7 in a direction of a cutting line AB. The active regions 202 and the isolation layer 203 are partially etched away by taking the mask layer 210 as a mask. A word line trench 204 is formed in the active regions 202 and the isolation layer 203. The word line trench 204 includes a first partial word line trench 204a located in the active regions 202 and a second partial word line trench 204b located in the isolation layer 203. The first partial word line trench 204a is interconnected with the second partial word line trench 204b. The width W1 and depth of the second partial word line trench 204b are greater than the corresponding width W2 and depth of the first partial word line trench 204a respectively.

The formed word line trench 204 includes a first partial word line trench 204a located in the active regions 202 and a second partial word line trench 204b located in the isolation layer 203. The first partial word line trench 204a is interconnected with the second partial word line trench 204b. The width W1 and depth of the second partial word line trench 204b are both greater than the width W2 and depth of the first partial word line trench 204a. Therefore, when a word line structure is formed in the word line trench 204 subsequently, the formed word line structure also includes a first partial word line structure located in the first partial word line trench and a second partial word line structure located in the second partial word line trench. The first partial word line structure is interconnected with the second partial word line structure. The width and depth of the second partial word line structure are both greater than the corresponding width and depth of the first partial word line structure. Indeed, such a "fin-type" word line structure across the active regions increases the contact area between the word line structure and the active regions, so that the control capability of the word line structure on a channel is improved, and the working frequency of a trench transistor is improved. Therefore, the working frequency of a memory (DRAM) is improved. Furthermore, by means of such a structure, the width of the channel of the trench transistor is increased, the working current of the trench transistor is increased, the threshold voltage of the trench transistor is reduced, and the performance of the memory (DRAM) is improved.

In the present embodiment, the active regions 202 and the isolation layer 203 are etched along the opening in the mask layer 210. Lateral etching the isolation layer 203 is added during the etching. Then, the word line trench 204 is formed in the active regions 202 and the isolation layer 203. In one embodiment, the etching process includes: adding an isotropic dry plasma etching step in an anisotropic dry plasma etching step. The isotropic dry plasma etching step is used for laterally etching the isolation layer 203 (when the isotropic dry plasma etching step is performed, the etching rate of the isolation layer 203 is far greater than the etching rate of the active regions 202, i.e. the etching amount of the active regions 202 is little or negligible). By the foregoing process, the width and depth of the second partial word line trench 204b formed in the isolation layer 203 can be accurately controlled to prevent the occurrence of electricity leakage, and the control of smaller width and depth dimensions of the second partial word line trench 204b can be realized. In one embodiment, an etching gas used in the anisotropic dry plasma etching step includes one or more selected from $Cl_2$, HBr, $CF_4$, $CHF_3$. An etching gas used in the isotropic dry plasma etching step includes one or more selected from $CF_4$, $CHF_3$, $CH_2F_2$. In one embodiment, the etching gas used in the anisotropic dry plasma etching step further includes one or more selected from helium or argon.

In a specific embodiment, the foregoing etching process for forming the word line trench 204 includes the following operations. Firstly, anisotropic dry plasma etching is performed to etch the active regions 202 and the isolation layer 203 by taking the mask layer 210 as a mask, such that a first etching trench in the active regions 202 and the isolation layer 203 is formed. The etching time is 15-25 s. The used etching gas includes $Cl_2$, HBr, $CF_4$, $CHF_3$, and He. The flow range of $Cl_2$ is 15-20 sccm, the flow range of HBr is 30-40 sccm, the flow range of $CF_4$ is 110-130 sccm, the flow range of $CHF_3$ is 90-110 sccm, and the flow range of He is 90-110 sccm. Then, isotropic dry plasma etching is performed to etch the isolation layer 203 at two sides of the first etching trench (in the same etching chamber), so that the width and depth of the corresponding part of the first etching trench in the isolation layer 203 are increased. The etching time is 3-8 s. The used etching gas includes $CF_4$ and $CH_2F_2$. The flow range of $CF_4$ is 40-60 ccm, and the flow range of $CH_2F_2$ is 18-33 sccm. Next, the anisotropic dry plasma etching is performed again, so that the depth of the first etching trench is increased until the word line trench 204 is formed in the active regions 202 and the isolation layer 203. The etching time is 15-25 s. The used etching gas includes $Cl_2$, HBr, $CF_4$, $CHF_3$, and He. The flow range of $Cl_2$ is 15-20 sccm, the flow range of HBr is 30-40 sccm, the flow range of $CF_4$ is 110-130 sccm, the flow range of $CHF_3$ is 90-110 sccm, and the flow range of He is 90-110 sccm. In the present embodiment, the word line trench 204 is formed by combining the foregoing etching steps and the foregoing specific etching process parameters, so that the width and depth precision of the second partial word line trench 204b formed in the isolation layer 203 are further improved, the occurrence of electricity leakage can be better prevented, and smaller width and depth dimensions of the second partial word line trench 204b can be better controlled.

In a specific embodiment, the width W2 of the first partial word line trench 204a is 17-25 nm, and the width W1 of the second partial word line trench 204b is 20-30 nm. The second partial word line trench 204b is wider than the first partial word line trench 204a by a width range (W1-W2) of 6-9 nm. The second partial word line trench 204b is deeper than the first partial word line trench 204a by a depth range D1 of 3-5 nm.

In the present embodiment, there are two word line trenches 204 in each active region 202 to facilitate the subsequent formation of a dual-trench transistor. Specifically, the two word line trenches 204 divide each active region 202 into a drain located in the middle and two sources located at two sides of the drain respectively.

In other embodiments, the forming process of the word line trench includes the following operations. A mask layer is formed on the active regions and the isolation layer, where the mask layer has a plurality of parallel openings (the widths of different positions of the openings are uniform or substantially the same), an extending direction of the openings and an extending direction of the active regions form an angle, and both a partial surface of the active regions and a partial surface of the isolation layer are exposed from each of the openings. The active regions and the isolation layer are etched along the openings, and lateral etching the isolation layer is added during the etching process, such that the word line trench in the active regions and the isolation layer is formed. The formed word line trench includes a first partial word line trench located in the active regions and a second partial word line trench located in the isolation layer. The first partial word line trench is interconnected with the second partial word line trench. Moreover, the width and depth of the second partial word line trench are greater than the corresponding width and depth of the first partial word line trench respectively.

Figure 9:
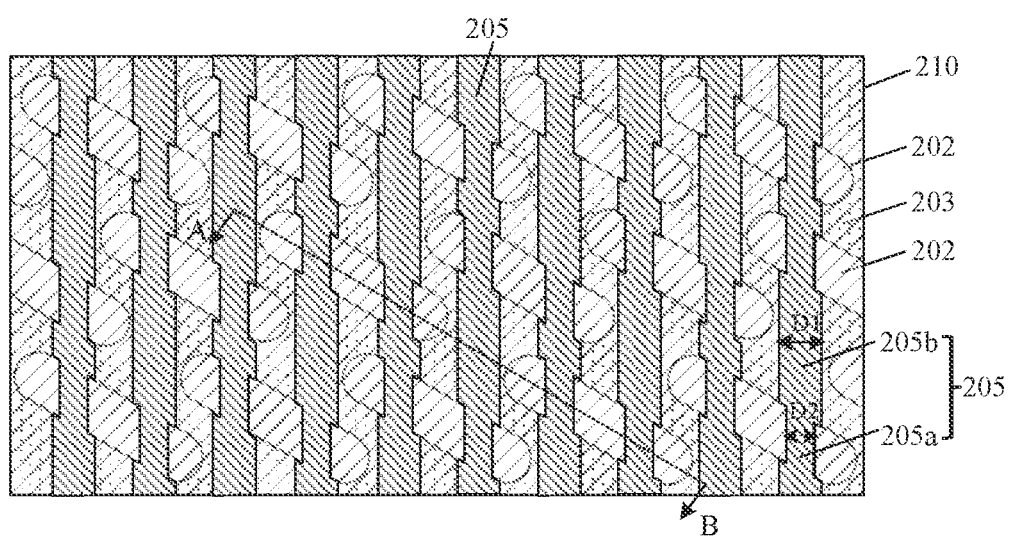
Figure 10:
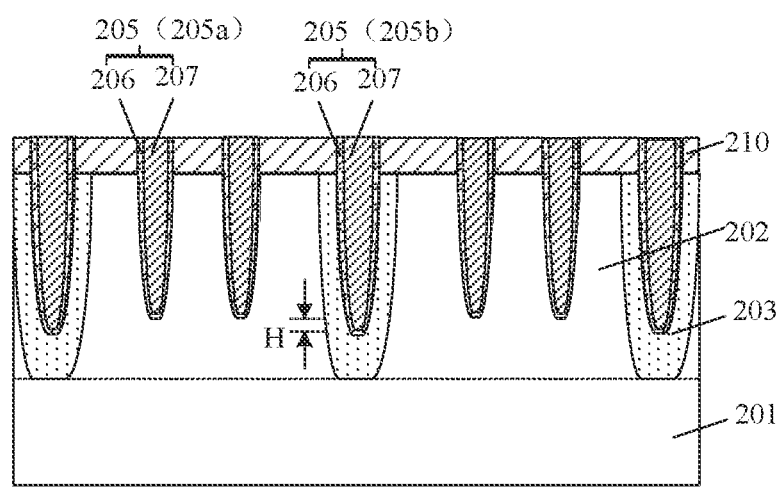

Referring to FIG. 9 and FIG. 10, FIG. 10 is a schematic diagram showing a cross-sectional structure of FIG. 9 in a direction of a cutting line AB. A word line structure 205 is formed in the word line trench 204 (referring to FIG. 7). The word line structure 205 includes a first partial word line structure 205a located in the first partial word line trench and a second partial word line structure 205b located in the second partial word line trench. The first partial word line structure 205a is interconnected with the second partial word line structure 205b. The width D1 and depth of the second partial word line structure 205b are greater than the width D2 and depth of the first partial word line structure 205a respectively.

In one embodiment, the word line structure 205 includes a gate dielectric layer 206 located both on the side walls and bottom surface of the word line trench, and a metal electrode 207 located on the gate dielectric layer 206 for filling the word line trench.

In a specific embodiment, the gate dielectric layer 206 may include a silicon oxide layer located on the sidewalls and bottom surface of the word line trench, and a barrier layer located on the silicon oxide layer.

The metal electrode 207 may be made of tungsten (W) or other suitable metal materials, and the barrier layer may be made of TiN.

In one embodiment, the width of the first partial word line structure 205a is 17-25 nm. The width of the second partial word line structure 205b is 20-30 nm. The second partial word line structure 205b is wider than the first partial word line structure 205a by a width range of 6-9 nm. The second partial word line structure 205b is deeper than the first partial word line structure 205a by a depth range of 3-5 nm. In this way, the control capability of the word line structure on the channel is higher, and accordingly the working frequency of the memory (DRAM) can be higher, while the integration level of the memory (DRAM) is ensured.

In one embodiment, the forming process of the word line structure 205 includes the following operations. A silicon oxide layer is formed both on the side walls and bottom surface of the word line trench, in particular by a thermal oxidation process. A barrier layer is formed on the silicon oxide layer and the mask layer 210. A metal layer is formed on the barrier layer. The metal layer and the barrier layer, higher than the surface of the mask layer 210, are removed by flattening, to form the word line structure 205.

Figure 11:
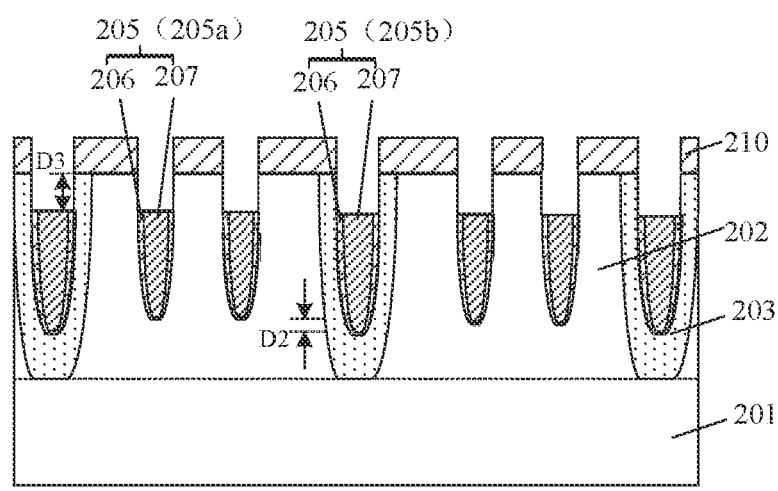
Figure 12:
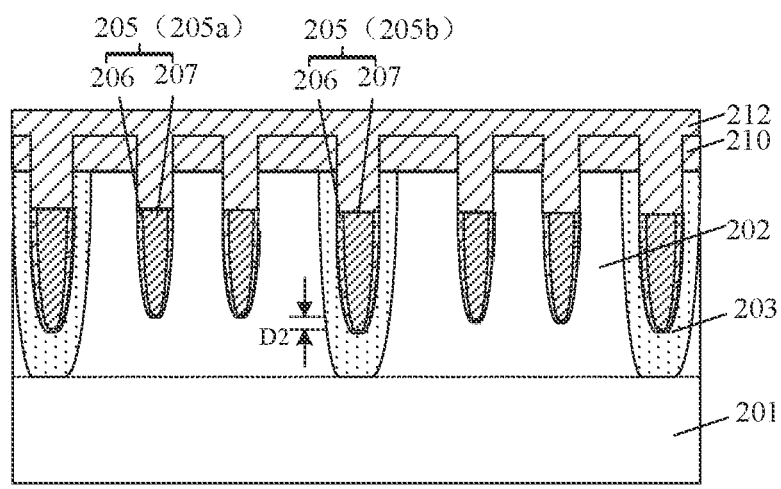

Referring to FIG. 11 and FIG. 12, FIG. 11 is performed on the basis of FIG. 10. The word line structure of a certain thickness is removed by etching back, so that the top surface of the remaining word line structure 205 is lower than the surface of the active regions 202 (referring to FIG. 11). The top of the remaining metal layer may be "Ω-shaped" (not shown in the figure). A protective layer 212 covering the remaining word line structure 205 and the mask layer 210 is formed.

The top surface of the remaining word line structure 205 is lower than the top surface of the active regions 202 by a depth range D2 of 60-75 nm.

The protective layer 212 may be used to prevent oxidation of the metal electrode 207 in the word line structure 205. The protective layer 212 is made of silicon nitride or other suitable materials.

After the protective layer is formed, the method may further include: forming a bit line (not shown in the figure) connected with the drain region and a capacitor (not shown in the figure) connected with the two source regions respectively.

Another embodiment of the disclosure provides a memory (DRAM). Referring to FIG. 9, FIG. 10, and FIG. 12. The memory includes a semiconductor substrate 201, a word line trench, and a word line structure 205.

The semiconductor substrate 201 has a plurality of separate active regions 202. The plurality of active regions 202 are isolated through an isolation layer 203.

The word line trench is located in the active regions 202 and the isolation layer 203. The word line trench includes a first partial word line trench located in the active regions and a second partial word line trench located in the isolation layer. The first partial word line trench is interconnected with the second partial word line trench. The width and depth of the second partial word line trench are greater than the corresponding width and depth of the first partial word line trench respectively.

The word line structure 205 is located in the word line trench. The word line structure 205 includes a first partial word line structure 205a located in the first partial word line trench and a second partial word line structure 205b located in the second partial word line trench. The first partial word line structure 205a is interconnected with the second partial word line structure 205b. The width D1 and depth of the second partial word line structure 205b are greater than the corresponding width D2 and depth of the first partial word line structure 205a respectively.

In one embodiment, the width of the first partial word line structure 205a is 17-25 nm. The width of the second partial word line structure 205b is 20-30 nm. The second partial word line structure 205b is wider than the first partial word line structure 205a by a width range of 6-9 nm. The second partial word line structure 205b is deeper than the first partial word line structure 205a by a depth range of 3-5 nm.

In one embodiment, referring to FIG. 12, a top surface of the word line structure 205 is lower than a surface of the active regions 202. The word line structure 205 includes a gate dielectric layer 206 located both on the side walls and bottom of the word line trench, and a metal electrode 207 located on the gate dielectric layer 206 for filling the word line trench. The top surface of the word line structure 205 is lower than the top surface of the active regions 202 by a depth range of 60-75 nm.

Two separate word line trenches are formed in each active region 202. The two word line trenches divide each active region into a drain region located in the middle and two source regions located at two sides of the drain region. The two separate word line trenches have respective word line structures therein. A bit line connected with the drain region and a capacitor connected with the two source regions respectively are further included.

It is to be noted that other definitions or descriptions of the memory (DRAM) in the present embodiment will be omitted, and reference may be made to the corresponding definitions or descriptions in the embodiments of the foregoing memory (DRAM) forming process.

Although the disclosure has been disclosed as above in preferred embodiments, they are not used to limit the disclosure. Any person skilled in the art may make possible variations and modifications on the technical solution of the disclosure by using the above-disclosed method and technical content without departing from the spirit and scope of the disclosure. Therefore, any simple modifications, equivalent variations and modifications made on the above embodiments according to the technical essence of the disclosure without departing from the content of the technical solution of the disclosure fall within the scope of protection of the technical solution of the disclosure.

The invention claimed is:

1. A method for forming a memory, comprising:
   providing a semiconductor substrate, wherein a plurality of separate active regions are formed on the semiconductor substrate and isolated through an isolation layer;
   forming a word line trench in the active regions and the isolation layer by etching, wherein the word line trench comprises a first partial word line trench located in the active regions and a second partial word line trench located in the isolation layer, the first partial word line trench is interconnected with the second partial word line trench, and a width and a depth of the second partial word line trench are greater than a width and a depth of the first partial word line trench respectively; and
   forming a word line structure in the word line trench, wherein the word line structure comprises a first partial word line structure located in the first partial word line trench and a second partial word line structure located in the second partial word line trench, the first partial word line structure is interconnected with the second partial word line structure, and a width and a depth of the second partial word line structure are greater than a width and a depth of the first partial word line structure respectively;
   wherein a forming process of the word line trench comprises:
      forming a mask layer on the active regions and the isolation layer, wherein the mask layer has a plurality of parallel openings, an extending direction of the openings and an extending direction of the active regions form an angle, and both a partial surface of the active regions and a partial surface of the isolation layer are exposed from each of the openings; and
      etching the active regions and the isolation layer along the openings, wherein lateral etching the isolation layer is added during the etching, to form the word line trench both in the active regions and the isolation layer.

2. The method for forming a memory of claim 1, wherein the etching comprises: adding an isotropic dry plasma etching step in an anisotropic dry plasma etching step, wherein the isotropic dry plasma etching step is used for laterally etching the isolation layer.

3. The method for forming a memory of claim 2, wherein an etching gas used in the anisotropic dry plasma etching step comprises one or more selected from $Cl_2$, HBr, $CF_4$, or $CHF_3$, and an etching gas used in the isotropic dry plasma etching step comprises one or more selected from $CF_4$, $CHF_3$, or $CH_2F_2$.

4. The method for forming a memory of claim 3, wherein the etching gas used in the anisotropic dry plasma etching step further comprises one or more selected from helium or argon.

5. The method for forming a memory of claim 1, wherein the width of the first partial word line trench is 17-25 nm and the width of the second partial word line trench is 20-30 nm.

6. The method for forming a memory of claim 1, wherein the second partial word line trench is wider than the first partial word line trench by a width range of 6-9 nm, and the second partial word line trench is deeper than the first partial word line trench by a depth range of 3-5 nm.

7. The method for forming a memory of claim 1, wherein the active regions are made of silicon and the isolation layer is made of silicon oxide.

8. The method for forming a memory of claim 1, wherein the word line structure comprises a gate dielectric layer located both on side walls and a bottom of the word line trench, and a metal layer located on the gate dielectric layer for filling the word line trench.

9. The method for forming a memory of claim 8, wherein a forming process of the word line structure comprises:
   forming the gate dielectric layer both on the side walls and a bottom surface of the word line trench;
   forming a barrier layer on the gate dielectric layer;
   forming a metal material layer on the barrier layer; and
   etching back the metal material layer to form the metal layer, wherein a top surface of the metal layer is lower than a top surface of the active regions.

10. The method for forming a memory of claim 9, wherein the top surface of the metal layer is lower than the top surface of the active regions by a depth range of 60-75 nm.

11. The method for forming a memory of claim 9, further comprising: forming a protective layer to cover the word line structure.

12. A memory obtained by the method for forming the memory of claim 1, comprising:
the semiconductor substrate, wherein the semiconductor substrate has the active regions, which are isolated through the isolation layer;
the word line trench located in the active regions and the isolation layer, wherein the word line trench comprises the first partial word line trench located in the active regions and the second partial word line trench located in the isolation layer, the first partial word line trench is interconnected with the second partial word line trench, and the width and the depth of the second partial word line trench are greater than the width and the depth of the first partial word line trench respectively; and
the word line structure located in the word line trench, wherein the word line structure comprises the first partial word line structure located in the first partial word line trench and the second partial word line structure located in the second partial word line trench, the first partial word line structure is interconnected with the second partial word line structure, and the width and the depth of the second partial word line structure are greater than the width and the depth of the first partial word line structure respectively.

13. The memory of claim 12, wherein the width of the first partial word line structure is 17-25 nm and the width of the second partial word line structure is 20-30 nm.

14. The memory of claim 12, wherein the second partial word line structure is wider than the first partial word line structure by a width range of 6-9 nm, and the second partial word line structure is deeper than the first partial word line structure by a depth range of 3-5 nm.

15. The memory of claim 12, wherein the word line structure comprises a gate dielectric layer located both on side walls and a bottom of the word line trench, and a metal layer located on the gate dielectric layer for filling the word line trench.

16. The memory of claim 15, wherein a top surface of the metal layer is lower than a top surface of the active regions by a depth range of 60-75 nm.

17. A method for forming a memory, comprising:
providing a semiconductor substrate, wherein a plurality of separate active regions are formed on the semiconductor substrate and isolated through an isolation layer;
forming a word line trench in the active regions and the isolation layer by etching, wherein the word line trench comprises a first partial word line trench located in the active regions and a second partial word line trench located in the isolation layer, the first partial word line trench is interconnected with the second partial word line trench, and a width and a depth of the second partial word line trench are greater than a width and a depth of the first partial word line trench respectively; and
forming a word line structure in the word line trench, wherein the word line structure comprises a first partial word line structure located in the first partial word line trench and a second partial word line structure located in the second partial word line trench, the first partial word line structure is interconnected with the second partial word line structure, and a width and a depth of the second partial word line structure are greater than a width and a depth of the first partial word line structure respectively;
wherein a forming process of the word line trench comprises:
forming a mask layer on the active regions and the isolation layer, wherein the mask layer has a plurality of parallel openings, an extending direction of the openings and an extending direction of the active regions form an angle, each of the openings comprises a plurality of first openings and a plurality of second openings which are arranged alternately and interconnected with each other, a width of each of the second openings is greater than a width of each of the first openings, a partial surface of the active regions is exposed from a bottom of a corresponding one of the first openings, and a partial surface of the isolation layer between two adjacent ones of the active regions is exposed from a corresponding one of the second openings; and
etching the active regions and the isolation layer along the first openings and the second openings, to form the word line trench both in the active regions and the isolation layer.

18. The method for forming a memory of claim 17, wherein the etching the active regions and the isolation layer along the first openings and the second openings is performed by using an anisotropic dry plasma etching process.

* * * * *